United States Patent [19]
Doll, Jr et al.

[11] Patent Number: 5,067,433
[45] Date of Patent: Nov. 26, 1991

[54] APPARATUS AND METHOD FOR APPLYING SOLDER TO AN ELECTRICAL COMPONENT

[75] Inventors: Wilfred A. Doll, Jr, Antwerp, Ohio; Gregory W. Ison, Fort Wayne, Ind.

[73] Assignee: ITT Corporation, New York, N.Y.

[21] Appl. No.: 395,241

[22] Filed: Aug. 15, 1989

[51] Int. Cl.⁵ .............................................. B05C 13/00
[52] U.S. Cl. ........................................ 118/500; 269/8; 269/37; 228/37
[58] Field of Search ........................ 118/500; 269/8, 37

[56] References Cited
U.S. PATENT DOCUMENTS
4,801,065 1/1989 Colquitt ............................ 228/37 X Primary Examiner—David S. Simmons
Assistant Examiner—Robert Barker
Attorney, Agent, or Firm—Arthur L. Plevy

[57] ABSTRACT

An apparatus and a method for applying a solder material to a square leadless chip carrier using a solder wave technique. The carrier is placed on a pallet so that one side of the carrier forms an angle of 45° to the direction of travel of the solder wave. The carrier has attachment pads spaced equidistantly around a peripheral surface thereof, and the carrier is retained on the holder so that the attachment pads are positioned adjacent the solder material. A solderable pin is positioned on the holder behind the carrier, when considered in the direction of movement of the pallet. One pin is necessary for each of the last pads to be soldered. The pin extends from the surface of the carrier a distance substantially equal to the distance the carrier extends from the pallet surface, and the area of the pin corresponds substantially to the area of a pad.

7 Claims, 3 Drawing Sheets

APPARATUS AND METHOD FOR APPLYING SOLDER TO AN ELECTRICAL COMPONENT

BACKGROUND OF THE INVENTION

This invention relates to the soldering of electrical components for surface mounting to printed circuit boards and more particularly to the processing of the components prior to such mounting.

At present there are two primary methods of joining electronic components to a printed circuit board. In one method, referred to as the leaded through-hole method, the components have wire leads protruding therefrom. The leads are placed through holes in the board and soldered to the circuit on the opposite side of the board.

The other more recent method involves mounting of the components directly onto the surface of the circuit board and is called the surface mount method. In this technique a solder paste is applied to the circuit board to form a desired pattern and the components are placed on the solder paste pattern and attachment of the components to the board is accomplished by a reflow process. The solder paste may be applied through a fine mesh screen or a thin metal stencil. The solder paste may also be dispensed through a small diameter tube in a desired pattern directly onto the circuit board.

In the surface mount approach solder pre-tin must be applied to untinned components before they are placed on a circuit board in order to fora a reliable solder connection at each point of contact between the component and the circuit board. In the case of leadless chip carriers (LCCs), pre-tinning of the component must be uniform across all of the attachment pads of the component in order to obtain uniform and controlled solder fillets at the board/lead interface. Numerous attempts have been made to pre-tin LCCs and obtain a uniform pre-tin. Robotic workcells designed for pre-tinning components have failed to produce consistent solder disposition with flat, four sided components such as LCCs.

Prior art FIG. 1 is a side view of a leadless chip carrier 10 with attachment pads 12 and pre-tin layers 14 and 14'. The LCC was pre-tinned by a standard wave soldering method. The relative direction of movement of the LCC is indicated by arrow A. In this method the carriers are placed in a pallet which moves from one end of a work cell to the other as the solder wave traverses the surface of the pads. Due to the unequal surface tension between the solder wave and the last set of attachment pads on the pallet, excess solder adheres to those pads.

As shown in FIG. 1, the pre-tin layer 14 on the pads 12 which are on the leading and midsection portions of the carrier (considered in the direction "B" of movement of the pallet) are even, but the pre-tin layer 14', on the pads 12 which are on the trailing portion of the carrier are uneven and have excess solder deposits. An operator then removes the excess solder by hand using a soldering iron. In many cases, too much solder is removed and the result is an LCC with too little solder on those pads.

It is therefore an object of the present invention to provide an apparatus which forms uniform pre-tin across all of the attachment pads of leadless chip carriers.

It is an additional object of the present invention to provide a method of pre-tinning leadless chip carriers which eliminates operator rework to remove excess solder following a pre-tin process.

It is a further object of the invention to provide a method of pre-tinning leadless chip carriers which is simple to perform and economical in cost.

SUMMARY OF THE INVENTION

These objects and others which will become apparent hereinafter are accomplished by the present invention which provides an apparatus for applying a solder material to a leadless chip carrier. The carrier has one surface with attachment pads for receiving the solder material and an opposed surface on which a metallic surface is located. The carrier is retained on a holder so that the one surface is positioned adjacent the solder material. Means are located on the holder a predetermined distance behind the carrier, when considered in the direction of movement of the solder, for maintaining surface tension at equilibrium between the pads and the solder material as the solder material traverses the length of the carrier and moves into and out of contact with the pads. This invention also provides a method of maintaining a substantially even surface tension between a solder material and a surface of a carrier containing attachment pads on which the solder is being deposited as the solder material traverses the pads.

BRIEF DESCRIPTION OF THE DRAWING

The above-mentioned and other features and objects of this invention will become more apparent by reference to the following description taken in conjunction with the accompanying drawing in which.

DESCRIPTION OF THE PREFERRED EMBODIMENT

Arrows "A" shown in the figures indicate the direction of movement of the carrier. Arrows "B" indicate the direction of flow of a molten solder material. Use of the words "leading" and "trailing" in the specification indicate directions taken with reference to the direction of movement of the carrier. The movement of the carrier is in a direction opposite to the direction of flow of the solder material or the solder wave.

Figure 2:
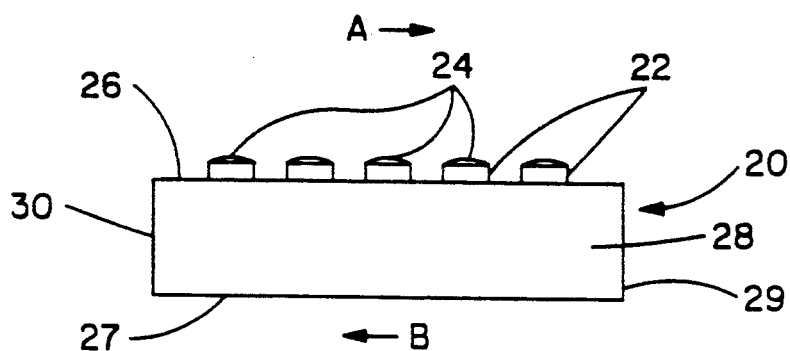
FIG. 2 is a side view of a leadless chip carrier soldered according to the present invention.

FIG. 2 shows a leadless chip carrier (LCC) 20 pre-tinned according to the present invention. Carrier 20 is any well known LCC device illustrated here as a square device. The device has a ceramic enclosure with four sides 28, a surface 27 which is a metallic lid and an opposed surface 26. The surface 26 has attachment pads 22 evenly distributed around its outer periphery. Any number of pads (20, 28, 36, etc.) may be located on the surface 26. The attachment pads 22 each have a pre-tin layer 24. A leading edge of the carrier 20 is indicated at 29 and a trailing edge at 30. All of the pads, processed according to this invention, have a uniform pre-tin deposition, and none of the pre-tin pads exhibits excess solder or solder bumps.

Figure 3:
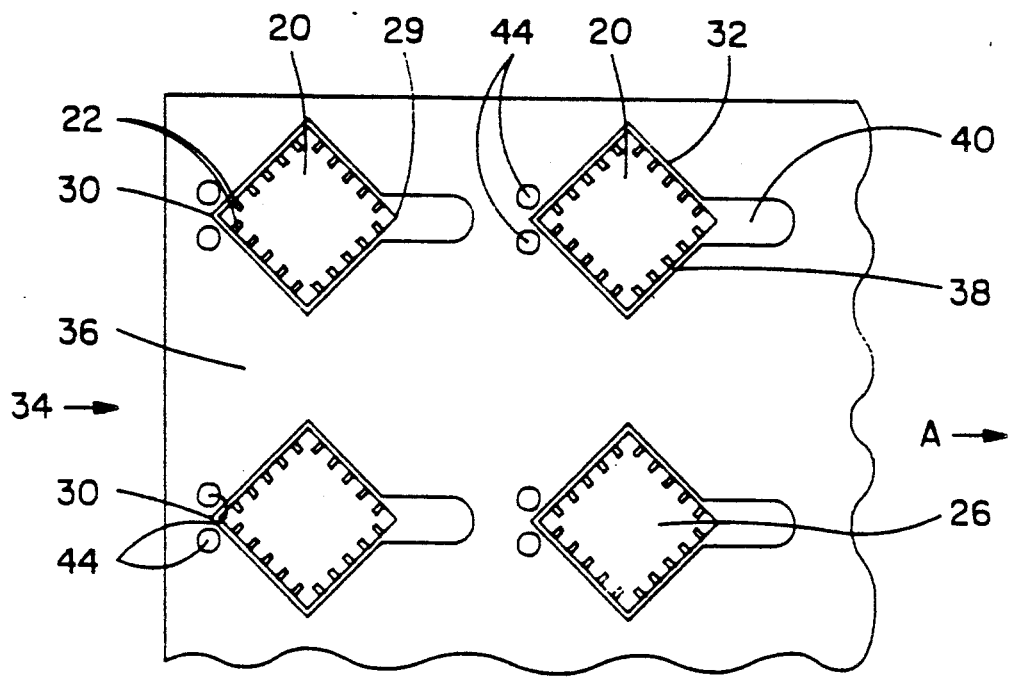
FIG. 3 is a top view of the soldering arrangement of the present invention.

Reference will now be made to FIG. 3 which shows a top view of the soldering arrangement of the invention. The LCCs are mounted in a pallet 34. The pallet 34 is designed to hold a large number of carriers at one time, for example, 75 carriers. Each of the carriers is mounted in a cavity 32 which extends into the pallet from a surface 36. The cavity 32 has a generally square section 38 and an elongate section 40 having one end extending from one corner of the section 38. The opposite end of the elongate section 40 faces the leading edge of the pallet 34. The bottom boundary 42 (shown in FIG. 5) of the cavity is generally planar.

The cavities are formed in the pallet so that each LCC, when mounted in the pallet, has one side which forms an angle of 45° to the direction of flow of the molten solder material. The importance of this angle will be discussed below.

The pallet 34 is preferably made of a phenolic material which has any known magnetic material added to it. The LCC is positioned in the section 38 with its metallic surface 27 positioned against the boundary 42. The magnetic attraction between the magnetic material of the pallet and the metallic surface 27 serves to hold the LCC in the cavity during the pre-tin operation and thus eliminates the need for complex processing apparatus. The elongate section 40 permits easy insertion and removal of the carrier.

Two solderable masses 44 made in accordance with the present invention are located in the pallet 34 at the trailing edge of each of the LCCs. The solderable masses of this invention are referred to herein as "solder thieves" and are described in more detail hereinbelow.

Figure 4:
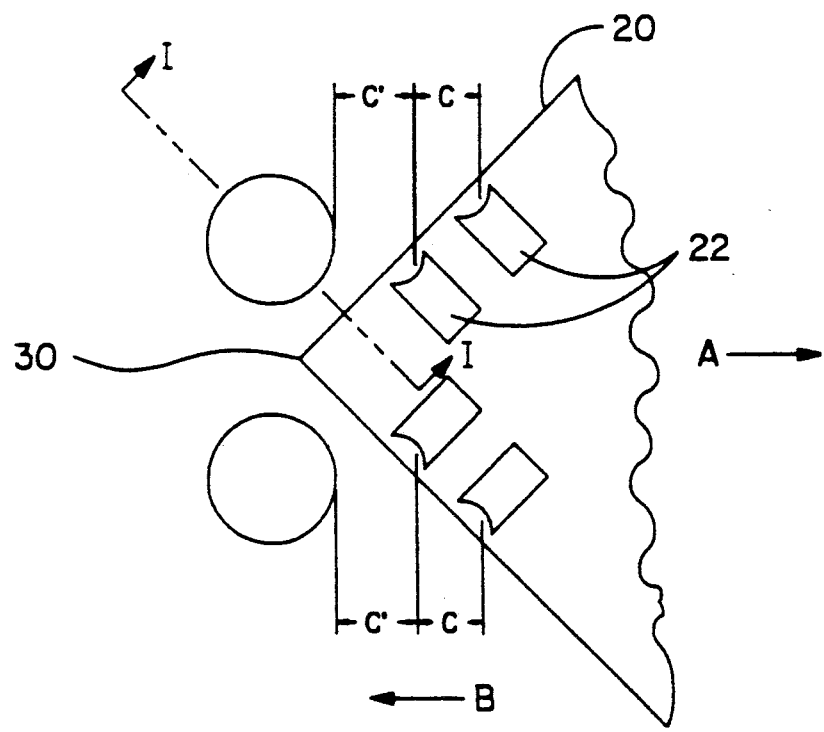
FIG. 4 is an enlarged view of one portion of FIG. 3.
Figure 5:
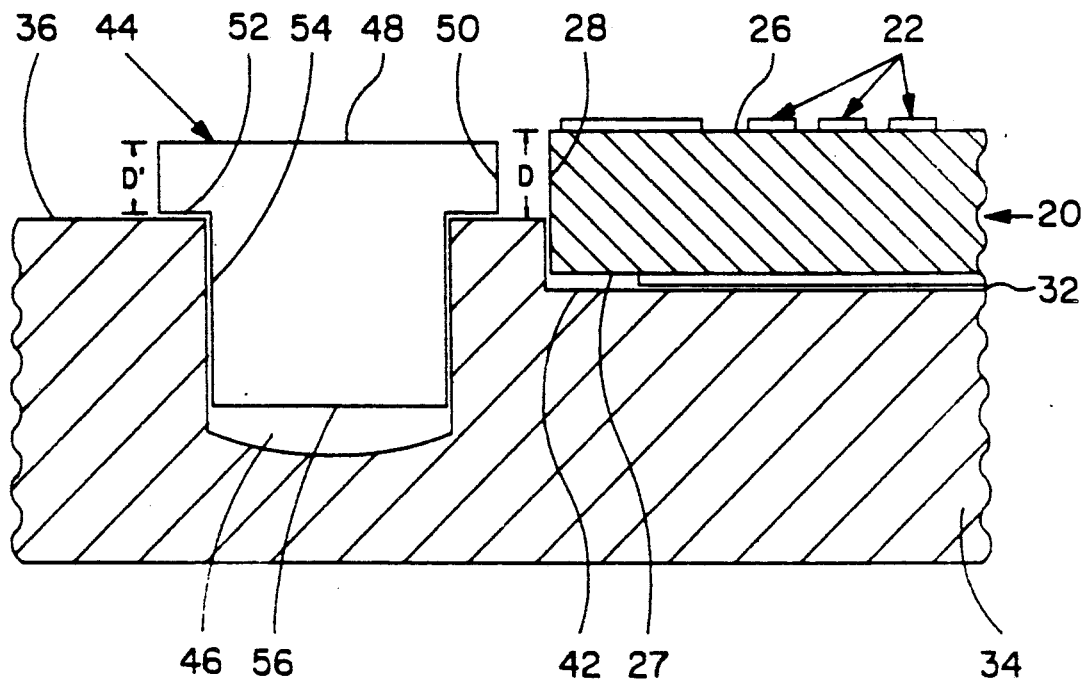
FIG. 5 is sectional view of the soldering arrangement taken along line I—I of FIG. 4.

Referring to FIGS. 4 and 5, each of the solderable masses 44 is placed in a recess 46 of the pallet 34 adjacent the trailing edge 30 of each of the carriers 20. The mass 44 has a size and is placed at a location in relation to the pads 22 at the trailing edge of the LCC such that it acts as another attachment pad thus causing the solder material breakaway surface tension to remain even across all of the pads on the LCC during pre-tin. Since the surface tension of the solder at each pad is even, the pre-tin applied will also be even and uniform. The solder thieves allow LCCs to be pre-tined in a cost effective manner, eliminating operator rework. In addition, the solder thieves eliminate the need for a costly specialized work cell since the pre-tin operation can be performed in well-known solder work cells.

The solderable mass 44 in a preferred form is a T-shaped pin made of brass. The pin 44 has a top surface 48, a cylindrical side 50 which is perpendicular to the surface 48, a shoulder 52 which is parallel to the top surface 48, and a cylindrical side 54 which is perpendicular to the shoulder 52. The bottom surface 56 is parallel to the top surface 48. The top surface 48 is dimensioned in area to correspond to an area equal to or slightly greater than the area of an individual LCC pad 22.

The side 50 has a height "D'" which corresponds to the height "D" of that portion of side 28 of LCC 20 which extends above the surface 36 when the LCC is mounted in the pallet 34. The pin 44 is positioned in the recess 46 with the shoulder 52 adjacent the surface 36 of the pallet 34. The pin 44 is located in the pallet so that the space "C'" between the side 50 of the pin and the next adjacent pad 22 is approximately the same as the space "C" between two adjacent pads 22 on LCC 20, when considered in the direction of movement of the pallet 34.

In a preferred arrangement, the LCC is placed at an angle of 45° to the direction of flow of the solder wave. With the arrangement, the distance "C" is about 0.020–0.025 inches for most square LCCs.

The pin 44 is press-fit into the recess 46 and remains in the pallet after the LCCs have been pre-tinned and removed from the cavities 32. Because the pin 44 is made of brass, it is durable and does not become loosened during the pre-tin operation.

While the shape and material described are preferred, any other configuration and material which will fulfill the design requirements discussed herein are within the scope of the invention. In a preferred form, one pin is used for each of the last pads to pass over the solder wave. However, the two pins 44 may, for example, be replaced by a single solderable mass as long as the spacing from the attachment pads and the height of the mass conform with the requirements specified herein.

The solderable mass 44 and its effect on surface tension will now be described with reference to FIGS. 6, 7 and 8 which illustrate the pre-tin operation. Arrows C indicate the direction of surface tension forces. A molten solder material is located in a reservoir (not shown). The pallet 34 is positioned with its surface 36 adjacent and parallel to the surface of the solder material. As the molten solder material enters the reservoir, a substantially transverse wave motion is transmitted to the solder material. A solder wave 60 is formed and travels in the direction of flow of the molten solder "B" which is opposite to the direction of movement of the pallet 34. The direction of motion of the solder material which creates the wave 60 is indicated by the arrows inside the wave. The pallet 34 is spaced from the surface of the solder material a distance which will permit the solder wave 60 to contact the attachment pads 22. The general solder wave technique is well known in the art.

Figure 6:
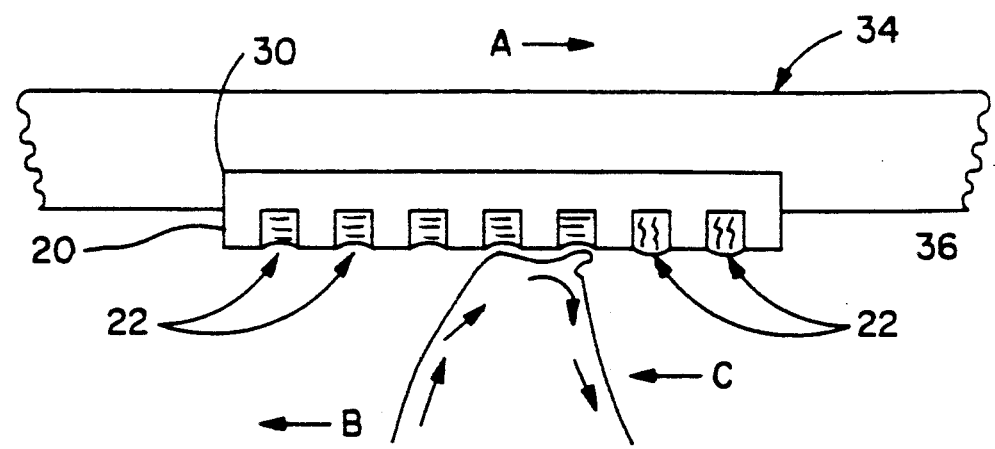
FIGS. 6 and 7 are diagrammatic illustrations of the surface tension forces present during solder application.
Figure 7:
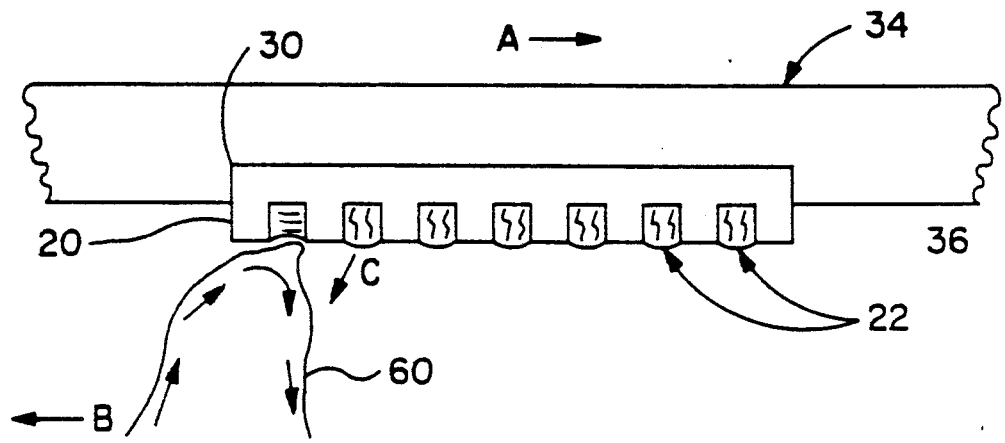

FIGS. 6 and 7 illustrate in diagrammatic form the relationship between the solder wave 60 and the pads 22 on the LCC 20 without employing a solder thieve. As the LCC 20 passes over the solder wave 60, the pads 22 come into contact with the molten solder material, pre-tinning them. As the pre-tined pad moves away from the solder wave, the surface tension of the molten solder to the pad 22 is overcome. The solder wave 60 then breaks away from the pad. The surface tension of the solder to the pad is overcome by the combined surface tension of the solder wave and the tension of the wave attachment to the pad positioned adjacent the wave. Since the individual pads on any one LCC are typically of the same geometry and evenly spaced, the amount of solder remaining on each pad as the molten solder snaps away is equal. This holds true for each pad which has a next adjacent trailing pad. Specific reference is made to FIG. 6.

Figure 1:
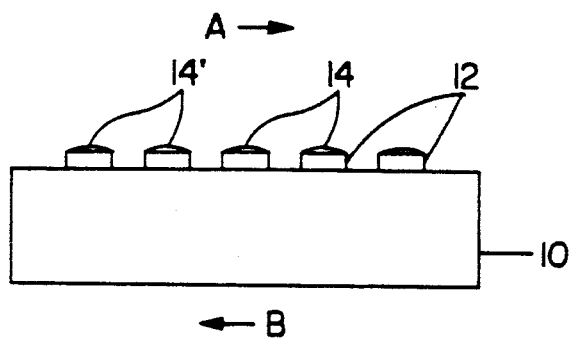
FIG. 1 is a side view of a leadless chip carrier soldered according to a prior art technique.

Referring to FIG. 7, it can be seen that the last pad 22 of the LCC 20 does not have a next adjacent trailing pad. In this situation, the surface tension configuration of the last pad to the solder wave is different than that where there is a next adjacent trailing pad. Since there is no pad to drain the solder material as the wave 60 breaks away from the single pad 22, more solder is pulled toward that pad, resulting in excess solder (solder bumps) as shown at 14' of FIG. 1. The excess solder must be removed by hand touch-up. This is typically a time consuming process and sometimes results in too much solder being removed.

Figure 8:
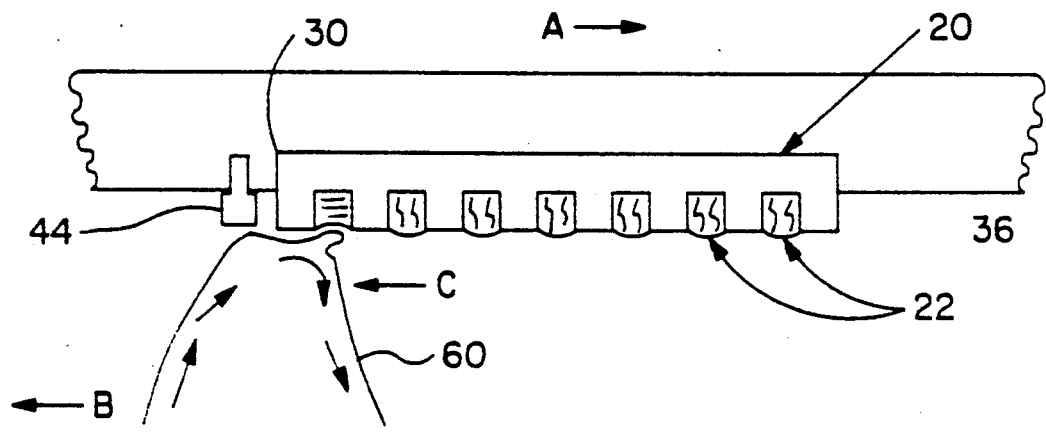
FIG. 8 is a diagrammatic view of the surface tension forces present during solder application according to the present invention.

FIG. 8 illustrates the surface tension relationship between the solder wave 60 and last pad of the LCC when a solder thieve 44 is added to the pallet. Since the solder thieve in a preferred implementation resembles the pad in its dimensions and spacing from the last pad, the solder wave breaks from the last pad on the trailing edge of the LCC and attaches to the solder thieve in the same manner as it had attached to the previous pads. The solderable mass (solder thieve) concept results in restoring the solder wave breakaway surface tension to equilibrium because the solder thieve becomes in effect the last pad.

The invention has been described with the LCC turned at an angle of 45° to the direction of flow of the solder material as shown in FIG. 4. Thus, two pads are the "last pads" on the trailing edge of each LCC. Since a T-shaped pin is used as a solder thieve in the embodiment described herein, one solder thieve is required for each pad.

Following the pre-tin process, the LCCs are removed from the pallet 34. The solder thieves are not removed. The solder deposited on the solder thieve will become molten and reform at the next pre-tin operation.

While we have described above the principles of our invention in connection with specific apparatus, it is to be clearly understood that this description is made only by way of example and not as a limitation to the scope of our invention as set forth in the objects thereof and in the accompanying claims.

We claim:

1. An apparatus for applying a solder material to a leadless chip carrier comprising:
   a pallet having a carrying surface which is moved in one direction of movement adjacent to a source of solder material, said carrying surface having a plurality of cavities therein each of which is shaped and adapted to hold a chip carrier inserted therein, each of said cavities having a shape matching that of the respective carrier, and an elongated recess portion extending from a leading edge of the carrier to allow easy insertion and removal of the carrier;
   a plurality of chip carriers held in said cavities of said pallet, wherein each chip carrier has a given thickness such that, when it is inserted in the respective cavity of said pallet, a first surface thereof faces toward the source of solder material and projects by a given height above said carrying surface, said first surface being formed in a quadrilateral shape with a diagonal axis thereof arranged in parallel with the direction of movement of said pallet such that said leading edge of the chip carrier is located at one end of the diagonal axis and is a first portion to make contact with the solder material, and an opposed trailing edge of the chip carrier is located at an opposite end of the diagonal axis and is a last portion to make contact with the solder material as the solder material traverses said upper surface by the relative movement of said pallet in said one direction of movement;
   each of said chip carriers having a pair of rows of contact pads symmetrically arranged on its first surface on opposite sides of the diagonal axis extending between said leading and trailing edges of the respective carrier, and each of said contact pads having a given solderable surface area and a predetermined spacing from its adjacent contact pads; and
   at least one solderable body for each chip carrier positioned on said carrying surface of said pallet spaced from the trailing edge of each respective chip carrier, said solderable body being spaced by a predetermined distance from the last ones of said contact pads in said rows which is substantially equal to the predetermined spacing between adjacent contact pads, and having a solderable surface area at least equal to the solderable surface area of said last contact pads and a height above said carrying surface of said pallet substantially equal to the height of said first surface of the chip carrier above said carrying surface of said pallet,
   whereby said at least one solderable body conforms in solderable surface area, height, and spacing to said contact pads such that the solder material will break away from the last contact pads at the trailing edge of the respective chip carrier and attach to said solderable body with a uniform surface tension as it attached to the contact pads.

2. The apparatus of claim 1, wherein said pallet includes a magnetic material, and said carriers include a metallic material such that said carriers are held in place in said cavities by magnetic force.

3. The apparatus of claim 1, wherein a pair of solderable bodies are provided for each carrier and are positioned on opposite sides of the diagonal axis spaced from the trailing edge of the respective carrier, wherein each solderable body is spaced from a last contact pad of the row of the respective side of the diagonal axis with the same spacing as between adjacent contact pads.

4. The apparatus of claim 1 wherein the first surface of the carrier is square and the predetermined distance is approximately 0.020-0.025 inch.

5. The apparatus of claim 4 wherein the carrier is positioned in said pallet such that a side of the carrier forms an angle of 45° to the direction of movement of the solder material.

6. The apparatus of claim 1 wherein the solderable body has a body section and a top section extending perpendicular to said body section, said body section being positioned in said carrying surface of said pallet and said top section being positioned on said carrying surface of said pallet and extending in parallel therewith.

7. The apparatus of claim 6 wherein the solderable body is a pin formed of brass.

* * * * *